US 6,341,644 B1

(12) United States Patent
Lo et al.

(10) Patent No.: US 6,341,644 B1
(45) Date of Patent: Jan. 29, 2002

(54) HEAT SINK ASSEMBLY

(75) Inventors: Wei-Ta Lo, Miou-Li; Chung-Yung Sun, Kee-Lung, both of (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/680,885

(22) Filed: Oct. 6, 2000

(30) Foreign Application Priority Data

Jul. 1, 2000 (TW) ........................................ 089211345

(51) Int. Cl.[7] ............................................... H05K 7/20

(52) U.S. Cl. ..................... 165/80.3; 361/697

(58) Field of Search .............................. 165/80.37, 121, 165/185; 361/697, 704; 257/722

(56) References Cited

U.S. PATENT DOCUMENTS 6,062,301 A * 5/2000 Lu .............................. 165/80.3
6,118,857 A * 9/2000 Clemens ....................... 361/697
6,137,680 A * 10/2000 Kodaira et al. ............. 361/697

* cited by examiner

Primary Examiner—Allen Flanigan

(57) ABSTRACT

A heat sink assembly includes a fan, a heat sink, and a fixing device which attaches the fan to the heat sink. The heat sink has a plurality of fins. Four catches are respectively formed on four outermost fins, two on each of two longitudinal sides of the base. The fixing device has a base and four legs depending from respective corners of the base. A pair of protrusions depends from the base near respective lateral sides of the base. Four poles extend upwardly from the base near respective corners of the base. Each leg defines an aperture for engaging with the corresponding catch of the heat sink. The fan defines four through holes for respectively receiving the poles of the fixing device.

13 Claims, 5 Drawing Sheets

HEAT SINK ASSEMBLY

BACKGROUND

1. Field of the Invention

The present invention relates to a heat sink assembly, and particularly to a heat sink assembly having a fixing device for readily and firmly attaching a fan to a heat sink.

2. The Related Art

Many electronic devices, such as Central Processing Units (CPUs), generate large amounts of heat during operation. This frequently deteriorates the operating stability of the electronic devices. Typically, a heat sink assembly with a fan is used to dissipate heat generated by an electronic device.

Referring to FIG. 5, a conventional heat sink assembly as disclosed in Taiwan Patent Application No. 86206427 includes a heat sink 70, a fan 50 and a fixing device 60 which attaches the fan 50 to the heat sink 70. The fan 50 is secured on the fixing device 60 with screws. Two arms 62 extend downwardly from opposite sides of the fixing device 60. Each arm 62 forms a catch 622. The fan 50 is attached to the heat sink 70 by the catches 622 engaging with apertures 72 defined in the heat sink 70.

However, securing the fan 50 to the fixing device 60 with screws is cumbersome and time-consuming. Furthermore, the fixing device 60 is attached to the heat sink 70 by means of just two catches 622 engaging with two apertures 72. This leaves the assembly prone to dislodgement when subjected to shock or vibration during normal operation.

An improved means of securing a fan to a heat sink, which overcomes the above problems, is desired.

SUMMARY OF THE INVENTION

Accordingly, an object of the present invention is to provide a heat sink assembly having a fixing device which firmly and reliably attaches a fan to a heat sink.

Another object of the present invention is to provide a heat sink assembly which is readily assembled and disassembled.

To achieve the above-mentioned objects, a heat sink assembly in accordance with the present invention comprises a fan, a heat sink, and a fixing device which attaches the fan to the heat sink. The heat sink has a chassis and a plurality of fins extending upwardly from the chassis. Four catches are formed on respective outermost fins, two on each of two longitudinal sides of the heat sink. The fixing device has a base and four legs depending from respective corners of the base. Four poles extend upwardly from the base near respective corners of the base. A pair of protrusions depends from the base near respective opposite lateral sides of the base. Each leg defines an aperture for engaging with the corresponding catch of the heat sink. The fan defines four through holes for receiving the poles of the fixing device. The fan is thereby firmly securable to the heat sink.

Other objects, advantages and novel features of the present invention will be apparent from the following detailed description of preferred embodiments of the present invention with reference to the attached drawings, in which:

DESCRIPTION OF THE PREFERRED EMBODIMENT

Figure 1:
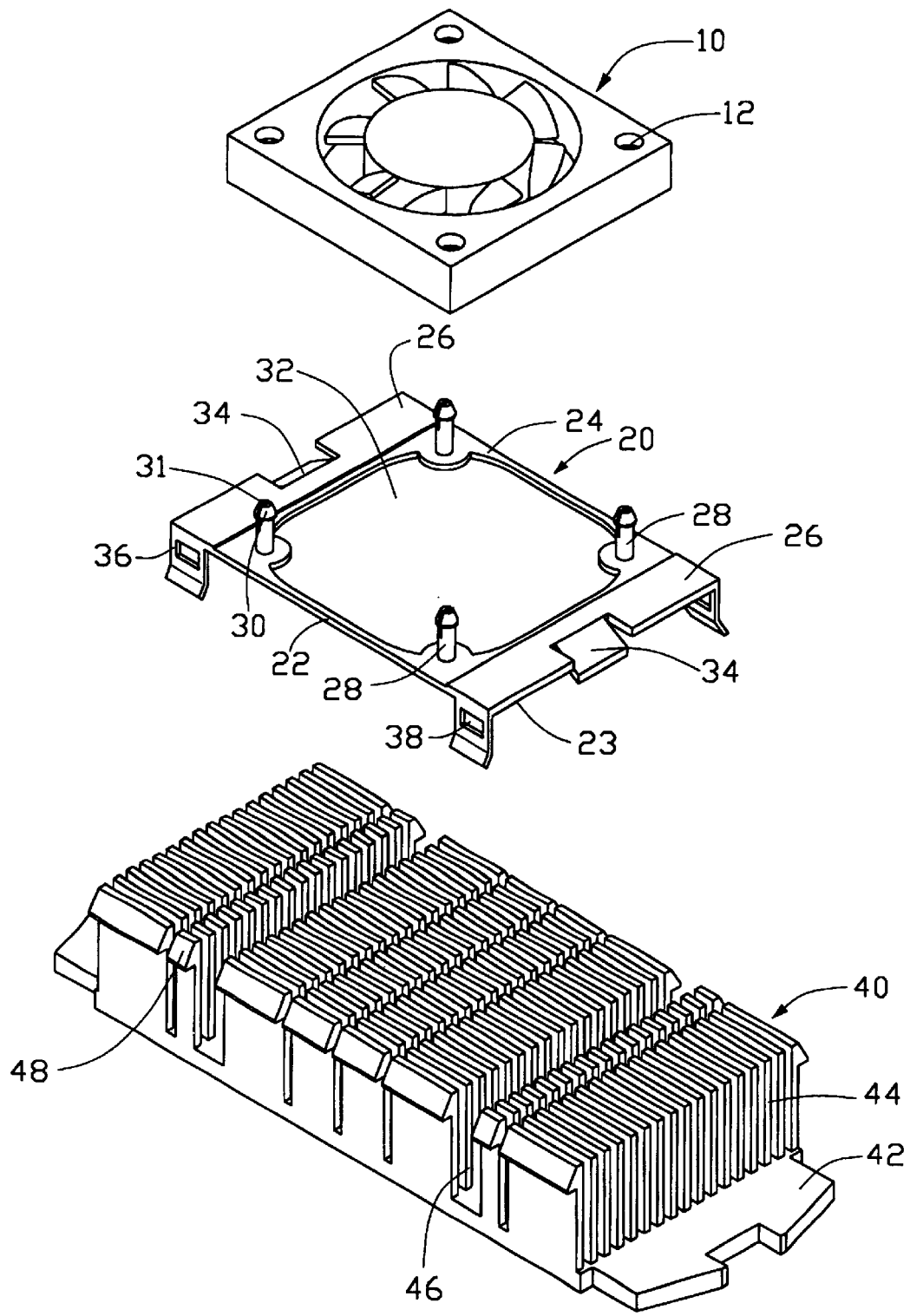
FIG. 1 is an exploded view of a heat sink assembly in accordance with the present invention.

Referring to FIG. 1, a heat sink assembly in accordance with the present invention comprises a fan 10, a heat sink 40, and a fixing device 20 which attaches the fan 10 to the heat sink 40.

The fan 10 is configured to a shape of a rectangular box, and defines a vertical through hole 12 at each corner thereof.

The heat sink 40 has a chassis 42 and a plurality of longitudinal fins 44 extending upwardly from the chassis 42. A plurality of grooves 46 is defined through the fins 44. Four external catches 48 are respectively formed at upper portions of four outermost fins 44, two on each of two longitudinal sides of the heat sink 40.

Figure 2:
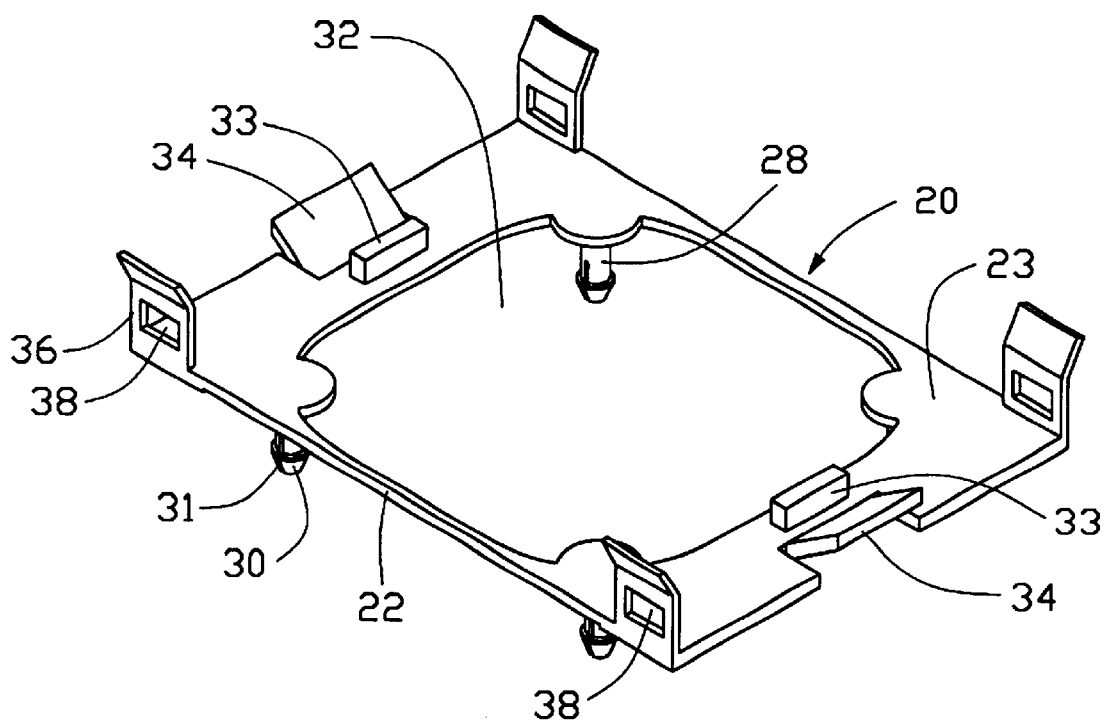
FIG. 2 is a perspective view of a fixing device of FIG. 1, but now inverted.

The fixing device 20 has a rectangular base 22 with a bottom face 23. The base 22 comprises a body 24 and a pair of shoulders 26 respectively formed on opposite lateral sides thereof. Top surfaces of the shoulder 26 are slightly higher than a top surface of the body 24, thereby forming a recess (not labeled) for accommodating the fan 10. The body 24 defines an opening 32 corresponding to a vent (not labeled) of the fan 10, for providing air flow access for the fan 10. Four poles 28 extend upwardly from four corners of the body 24 respectively. The poles 28 surround the opening 32, and correspond to the four through holes 12 of the fan 10 respectively. Each pole 28 has a tapered spring head 30 with a vertical slit 31 defined in a top face thereof, for easily entering into and engaging with the corresponding through hole 12 of the fan 10. A pair of legs 36 depends from opposite sides of each shoulder 26. Each leg 36 defines an aperture 38 corresponding to the catch 48 of the heat sink 40. An inclined resilient tab 34 is stamped downwardly from an outer middle portion of each shoulder 26 between the legs 36. Also referring to FIG. 2, a pair of protrusions 33 is formed on respective opposite lateral sides of the bottom face 23 of the base 22, between the resilient tabs 34.

Figure 3:
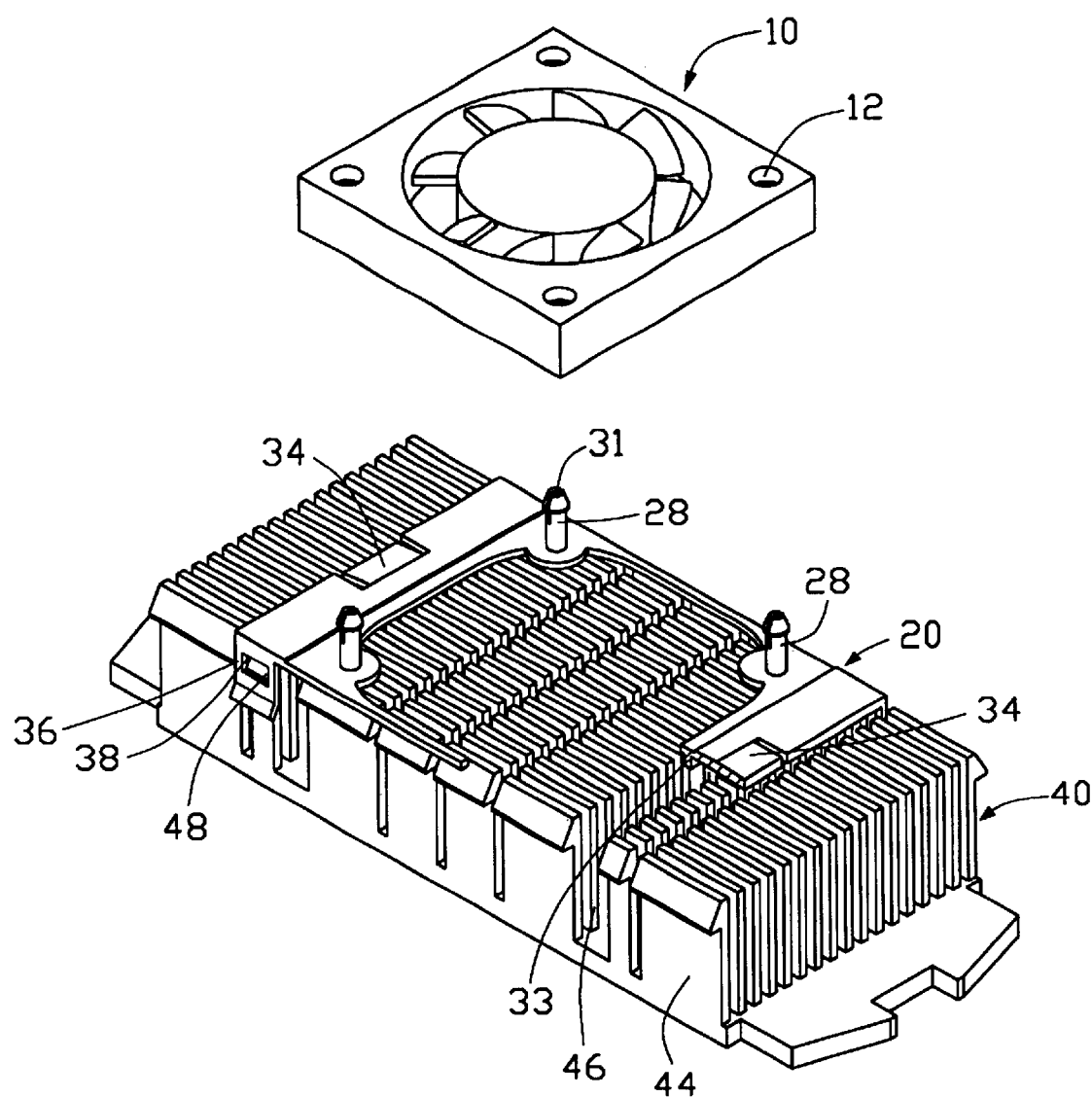
FIG. 3 is a partly assembled view of FIG. 1, showing the fixing device with a portion cut away mounted on the heat sink.
Figure 4:
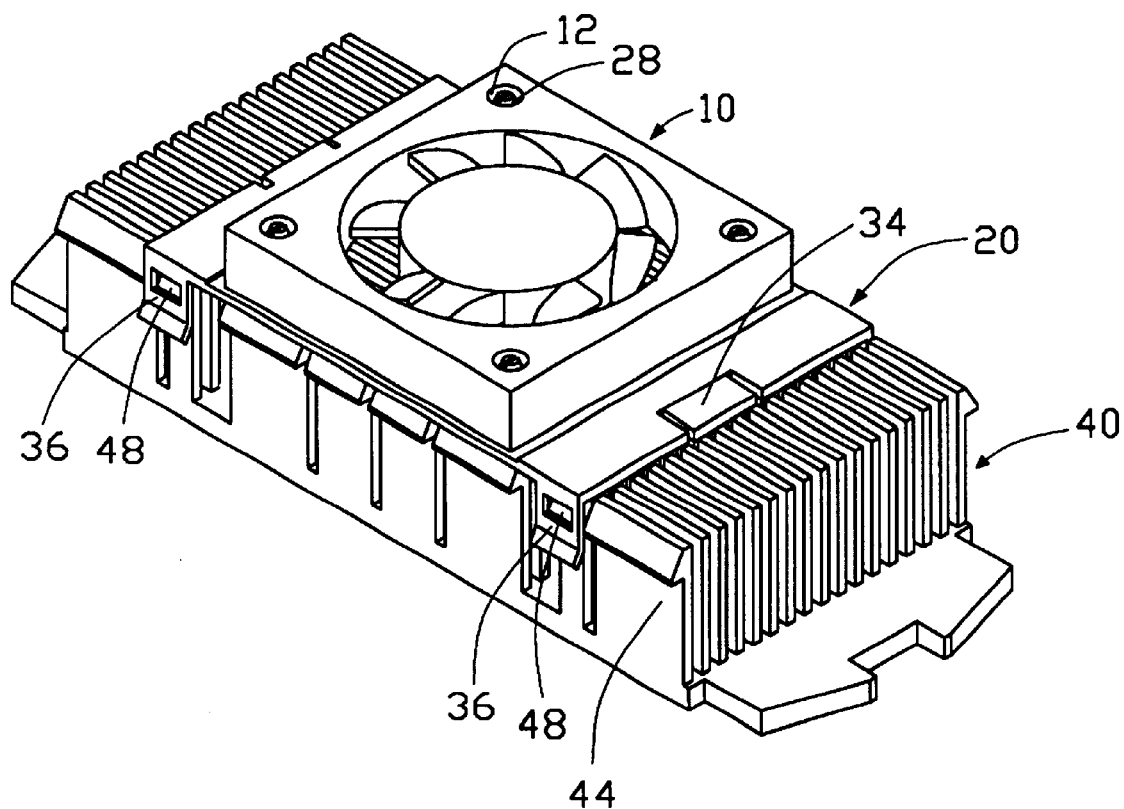
FIG. 4 is a completely assembled view of FIG. 1.
Figure 5:
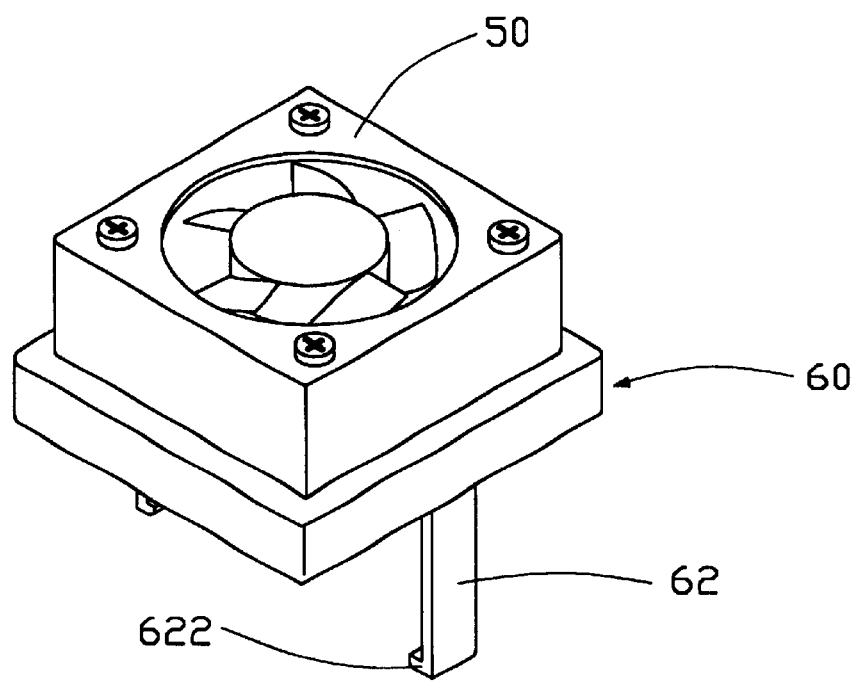
FIG. 5 is an exploded view of a conventional heat sink assembly.
Figure 5:
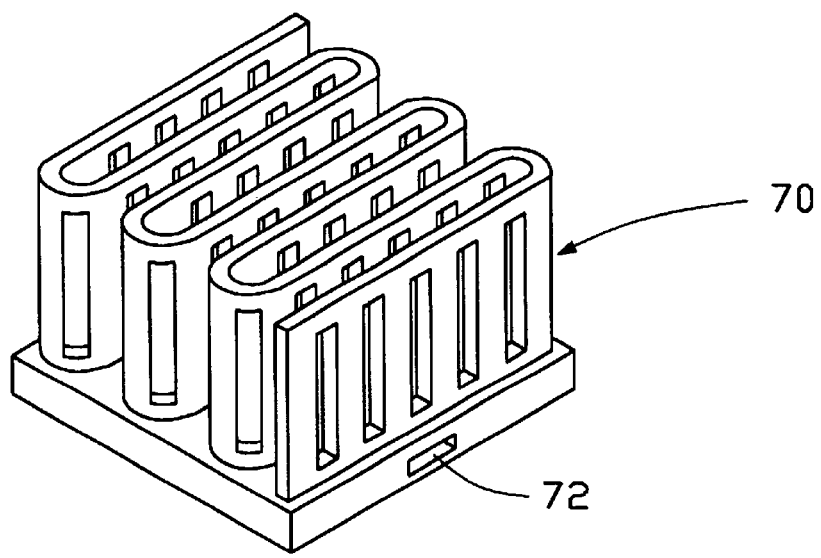

Referring to the FIGS. 3 and 4, in assembly, the fixing device 20 is pushed on top of the heat sink 40. The protrusions 33 of the fixing device 20 are received in the corresponding grooves 46 of the heat sink 40, and engage with corresponding side edges (not labeled) of the fins 44. The aperture 38 of each leg 36 engages with the corresponding catch 48 of the fin 44. The resilient tab 34 presses against corresponding top surfaces (not labeled) of the fins 44. Thus the fixing device 20 is firmly attached to the heat sink 40. Then the fan 10 is put into the recess (not labeled) of the fixing device 20, with the poles 28 of the fixing device 20 extending into and engaging with the respective through holes 12 of the fan 10. Thus the fan 10 is readily and firmly attached to the heat sink 40.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink assembly comprising:
   a heat sink having a plurality of fins, at least two fins each having a catch;

a fixing device having a base, at least two legs extending from the base and each defining an aperture engagingly receiving a corresponding catch of each of the at least two fins, and at least two poles extending from the base in a direction substantially opposite to the legs; and a fan mounted on the base of the fixing device, the fan defining at least two through holes for receiving the at least two poles.

2. The heat sink assembly as described in claim 1, wherein a pair of protrusions extends from the base of the fixing device in substantially the same direction as the legs, for interferentially engaging with fins of the heat sink.

3. The heat sink assembly as described in claim 1, wherein each pole of the fixing device has a tapered spring head for easily extending into and engaging with the corresponding through hole of the fan.

4. The heat sink assembly as described in claim 1, wherein the base of the fixing device defines an opening for providing air flow access for the fan.

5. The heat sink assembly as described in claim 1, wherein at least a pair of resilient tabs extends from near to respective opposite sides of the base of the fixing device, for pressing against the heat sink.

6. A heat sink assembly comprising:

a heat sink including a chassis with a plurality of fins extending therefrom and defining a groove among said fins;

two opposite catches formed on the heat sink;

a fixing device positioned on the heat sink, said fixing device including a base with two opposite legs latchably engaged with the corresponding catches respectively, at least one protrusion formed on a bottom face of the base and snugly received in said groove for limiting relative horizontal movement between the heat sink and the fixing device, and at least one resilient tab abutting against the heat sink for enhancement of latching between the catch and the leg; and a fan fastened onto the fixing device and opposite to the heat sink.

7. The heat sink assembly as described in claim 6, wherein said two-catches are formed on two corresponding fins, respectively.

8. The heat sink assembly as described in claim 7, wherein said two catches are formed on tip portions of the two corresponding fins, respectively.

9. A heat sink assembly comprising:

a heat sink having a plurality of fins, at least two fins each having a catch;

a fixing device having a base, at least two legs extending from the base and engaging with the catches of the at least two fins, at least two poles extending from the base in a direction substantially opposite to the legs, and at least a pair of resilient tabs extending from near to respective opposite sides of the base for pressing against the heat sink; and a fan mounted on the base of the fixing device, the fan defining at least two through holes for receiving the at least two poles.

10. The heat sink assembly as described in claim 9, wherein a pair of protrusions extends from the base of the fixing device in substantially the same direction as the legs, for interferentially engaging with fins of the heat sink.

11. The heat sink assembly as described in claim 9, wherein each leg defines an aperture for engagingly receiving the corresponding catch of the heat sink.

12. The heat sink assembly as described in claim 9, wherein each pole of the fixing device has a tapered spring head for easily extending into and engaging with the corresponding through hole of the fan.

13. The heat sink assembly as described in claim 9, wherein the base of the fixing device defines an opening for providing air flow access for the fan.

* * * * *